United States Patent [19]

Zimmermann et al.

[11] Patent Number: 4,779,620

[45] Date of Patent: Oct. 25, 1988

[54] NUCLEAR MAGNETIC RESONANCE TOMOGRAPHY APPARATUS AND METHOD

[75] Inventors: Bernd-Hellmut Zimmermann, Roettenbach; Peter Czygan, Nuremberg, both of Fed. Rep. of Germany

[73] Assignee: Siemens Aktiengeseelschaft, Berlin and Munich, Fed. Rep. of Germany

[21] Appl. No.: 865,998

[22] Filed: May 22, 1986

[30] Foreign Application Priority Data

Jun. 11, 1985 [DE] Fed. Rep. of Germany ....... 3520900

[51] Int. Cl.$^4$ ............................................. A61B 5/05
[52] U.S. Cl. .................................. 128/653; 128/721; 324/309; 324/312
[58] Field of Search ................ 128/653, 721; 324/307, 324/309, 312; 382/6, 43

[56] References Cited

U.S. PATENT DOCUMENTS 4,070,611 1/1978 Ernst .
4,532,474 7/1985 Edelstein ............................ 324/309
4,614,195 9/1986 Bottomley et al. ................. 128/653

FOREIGN PATENT DOCUMENTS 0093897 11/1983 European Pat. Off. .
0096487 12/1983 European Pat. Off. .
0117725 9/1984 European Pat. Off. .
0132975 2/1985 European Pat. Off. .
2161275 1/1986 United Kingdom ................ 324/307

OTHER PUBLICATIONS

"Magnetic Resonance Imaging With Respiratory Gating: Techniques and Advantages", Ehman et al., American Journal of Radiology, vol. 143, Dec. 1984, pp 1175–1182.
"Hereditary Hemorrhagic Telangiectasia: Sonographic Findings in the Liver[1]," Cloogman, et al. Radiology, Feb. 1984, pp. 521–522.

Primary Examiner—Ruth S. Smith
Attorney, Agent, or Firm—Hill, Van Santen, Steadman & Simpson

[57] ABSTRACT

A nuclear magnetic resonance tomography apparatus generates a tomographic image substantially free from artifacts caused by body movement, such as respiration, during acquisition of the tomography signals. The tomography signals are acquired and stored in the form of Fourier lines in an image matrix. For reducing image artifacts, a control unit is provided for controlling entry of the acquired tomography signals into the matrix in dependence upon a repiratory signal obtained from a sensor. The control unit insets the Fourier lines in the matrix such that Fourier lines occurring when the respiratory signal exceeds a predetermined value are alternately inserted above and below the middle of the matrix proceeding from the matrix middle, and the remaining Fourier lines are inserted into the matrix above and below the matrix middle proceeding from an edge of the matrix.

12 Claims, 2 Drawing Sheets

4,779,620

NUCLEAR MAGNETIC RESONANCE TOMOGRAPHY APPARATUS AND METHOD

BACKGROUND OF THE INVENTION

1. Field of the Invention

The present invention relates to tomography devices employing nuclear magnetic resonance for generating a tomographic image, and in particular to such devices wherein a projection of the nuclear spin is acquired on a frequency axis as a Fourier line and the image of the examined slice is calculated by Fourier transformation from the Fourier lines.

2. Description of the Prior Art

Nuclear magnetic resonance tomography devices operate based on the known principle that the hydrogen nuclear spin of an examination subject can be deflected from a preferred or equilibrium direction, imposed by a fundamental magnetic field, by means of a high-frequency excitation pulse. At the conclusion of the excitation pulse, the nuclear spins require a certain relaxation time to return to the equilibrium position. During this time, the spins precess with a frequency which is dependent on the strength of the fundamental magnetic field. This precessional motion can be detected with an RF antenna and associated receiver circuits. By superimposing a first field gradient on the uniform fundamental magnetic field, so that the magnetic field distribution spatially varies, identification of the spatial orientation of the spin (the gradient direction) can be undertaken by analyzing the measured frequency.

It is also known, before the signals in the first gradient are read out, to undertake a locus coding along a second spatial axis by briefly applying a second gradient field with variable amplitude or variable time duration. The second gradient field is applied orthogonally to the first gradient field, and slice images of the examination subject can be produced in this manner. Excitation of the nuclear spins in the slice of the examination subject is achieved because the fundamental magnetic field is influenced by a third gradient field disposed perpendicularly with respect to both the first and second gradient fields. The influence on the fundamental field is such that excitation of the spin occurs only in the slice of interest. This is possible because the excitation occurs with a frequency which is strictly allocated to the slice of interest. This method is described, for example, in German OS 26 11 497.

It is also known to store the acquired signals obtained during the spin relaxation time in a matrix in the form of Fourier lines, and to generate the image of the slice of interest by subjecting the lines to Fourier transformation.

Conventional devices operating as described above undertake a large number of sequential measuring events, so that a complete measurement for a particular layer is of a duration such that movement of the examination subject, for example, due to heart beat or respiration, takes place during the measurement and is present in the image as a disturbance or artifact. One method to avoid such disturbances is to control the acquisition of the measured values in dependence upon an EKG signal, or in dependence upon the patient's respiratory phase. When the acquisition of signals is controlled based on the respiratory phase, acquisition of measured values is only enabled for a relatively brief time span in each respiratory phase. This requires a considerable lengthening of the total measuring time, which is not always acceptable in practice.

SUMMARY OF THE INVENTION

It is an object of the present invention to provide a nuclear magnetic resonance tomography apparatus wherein movement artifacts produced by respiratory movements are substantially reduced and the measuring time is considerably shortened while control of the acquired signals is nonetheless undertaken based on the patient's respiratory phase.

The above object is inventively achieved in a nuclear magnetic resonance tomography apparatus having a matrix entry control unit for controlling entry or intercalation of the Fourier lines corresponding to the acquired data into the measuring or storage matrix such that Fourier lines acquired at a time during which the movement (respiratory) signal exceeds a predetermined value are entered proceeding from the middle of the measuring matrix, and the remaining Fourier lines are inserted in the matrix proceeding from the edge of the matrix. Entry of the lines under both circumstances is done in a symmetrical alternating fashion with respect to the middle of the matrix. By setting a threshold in the nuclear magnetic resonance tomography apparatus, a discrimination of the Fourier lines occurs, and the lines are inserted into the measuring matrix with reference to the movement signal. The overall measuring procedure thus does not require any additional time than the signal-acquiring process in nuclear magnetic resonance tomography wherein no moving phase control is undertaken. The image quality is thereby substantially improved in comparison thereto.

DESCRIPTION OF THE PREFERRED EMBODIMENTS

Figure 1:
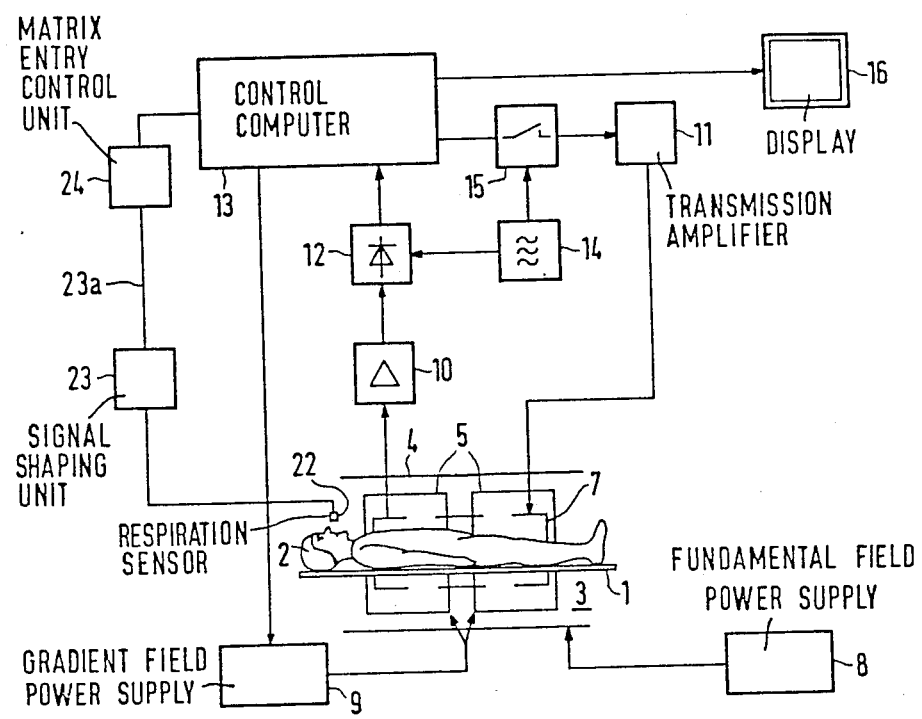
FIG. 1 is a schematic block diagram of a nuclear magnetic tomography apparatus constructed in accordance with the principles of the present invention.

A nuclear magnetic resonance tomography apparatus constructed in accordance with the principles of the present invention is shown in FIG. 1 having a support 1 on which an examination subject lies. Images of selected layers of the examination subject 2 are to be generated using the principles of nuclear magnetic resonance. For this purpose, a coil system 3 is provided including a coil 4 for generating a uniform fundamental magnetic field and gradient coils 5 for varying the fundamental magnetic field, and an excitation and measuring coil 7. The coil 4 is connected to a fundamental field power supply 8 and the gradient coils 5 are connected to a gradient field power supply 9. The excitation and measuring coil 7 is connected to a preamplifier 10 and, through suitable coupling elements, to a transmission amplifier 11. The measured signals which is the output of the preamplifier 10 is supplied through a phase-sensitive rectifier 12 to a process control computer 13 which controls the overall measuring procedure. The excitation pulse is generated by a high-frequency oscillator 14 which is connectible to the transmission amplifier 11 through a modulator 15. The images reconstructed from the measured signals are displayed on a monitor 16.

For the purpose of producing a slice image of the examination subject 2 disposed within the coil system 3, the spins in the slice of interest are first excited.

Figure 2:
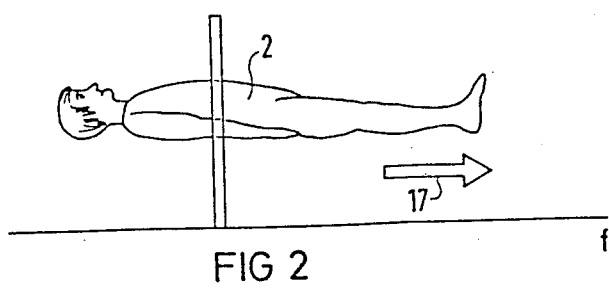
FIG. 2 is a schematic illustration showing the relative orientation of the patient, the tomographic slice of interest, and a fundamental field gradient in the apparatus of FIG. 1.

FIG. 2 schematically shows that the excited slice in the examination subject 2 is defined by the topical dependency of the flux density, and thus by the nuclear resonant frequency. The field gradient for the fundamental field is schematically shown in FIG. 2 referenced at 17. The resonant frequency is referenced f. An excitation of the spin only in the illustrated region of the examination subject 2 occurs.

After excitation, coding of the spin with respect to the second spatial axis is undertaken by applying a gradient of short duration in the second spatial direction, referred to below as the coding gradient. Subsequently the nuclear resonance signal is read in the form of a readout gradient, which defines the first spatial dimension. This step is repeated with coding gradients which have changed, for example, in steps from positive to negative. The nuclear resonance signals read out to a specific coding gradient amplitude are referred to as a Fourier projection.

Figure 3:
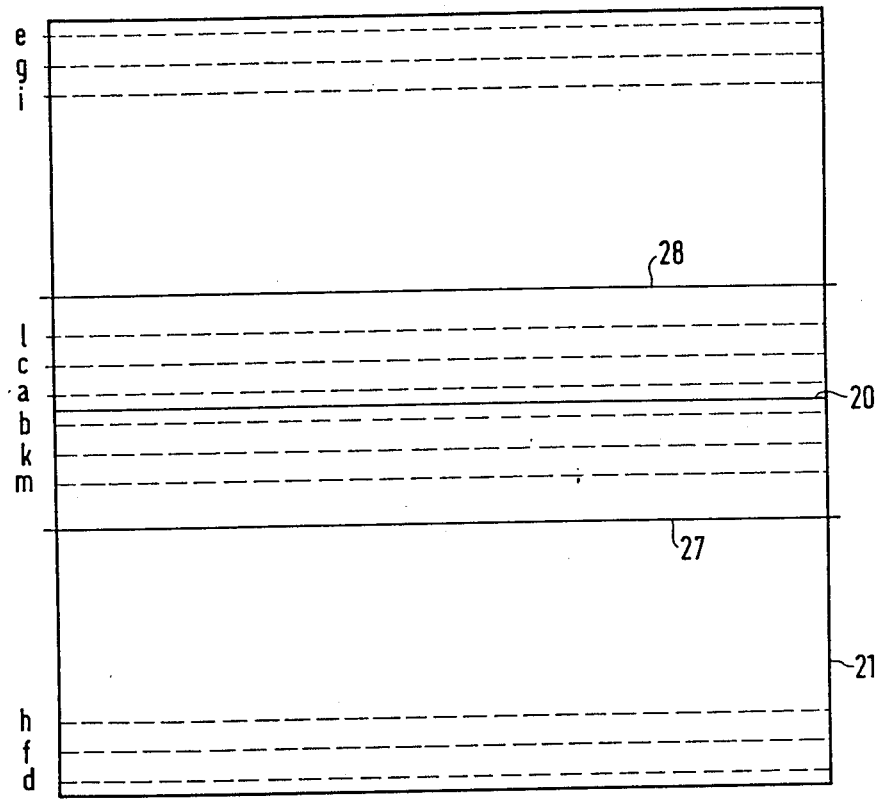
FIG. 3 is schematic illustration showing the sequence of entry of the Fourier lines in the measuring matrix in accordance with the principles of the present invention.

The measured signals corresponding to the successive Fourier projections correspond to parallel Fourier lines in a measuring matrix 21 shown in FIG. 3. The matrix 21 may, for example, be a part of the control computer 13 such as a memory. In practice, 256 Fourier lines, for example, can be provided for a complete measuring matrix. The zero Fourier line 20, which is associated with the coding gradient having a zero amplitude, is disposed in the middle of the measuring matrix 21 as shown in FIG. 3. An image of the examined layer can be calculated from the measured signals of the individual Fourier lines by undertaking a two-dimensional Fourier transformation according to rows and columns.

When acquisition of the measured values is uninterrupted, movement artifacts occur in the resulting image. As discussed above, it is therefore known to monitor the respiration curve of the examination subject 2 with a suitable sensor, and to electronically edit the respiration signal such that measured signals can only be recorded in a defined time interval of each respiratory phase. All other measurements arising outside of this interval are discarded. In order to obtain the least possible motion blur in the images, the time interval must be as short as possible. The measuring time during which useful signals are acquired and compared to the total measured signal acquisition time is considerably lengthened.

A minimum of 256 discrete exposures must be made for a matrix such as that shown in FIG. 3 having 256 lines. In a measuring apparatus controlled in accordance with the respiratory phase, the coding gradient can be advanced only after a measurement in the enabled status, because measurements not occurring during the enabled status are discarded.

In accordance with the principles of the present invention, a substantially complete suppression of respiration-cased movement artifacts in the resulting images can be obtained by inserting the Fourier lines into the measuring matrix 21 such that Fourier lines occurring at a time during which the respiration signal exceeds a predetermined value are inserted on alternating sides of the middle of the measuring matrix 21 proceeding from the middle. The remaining Fourier lines are inserted from the edges of the matrix 21, alternating above and below the center of the measuring matrix 21. The quality of the image produced in this manner is thereby largely uninfluenced by movements of the examination subject 2, and the measuring time is not lengthened in comparison to constant measured signal acquisition times.

In order to control acquisition of the measured signal by the respiratory phase, a respiration detector 22 is provided for monitoring the respiratory phase of the examination subject 2. The respiration detector 22 forms a respiratory phase signal which is suitable shaped in a signal shaping unit 23 and supplied via line 23a to a matrix entry control unit 24. The matrix entry control unit 24 controls insertion of the Fourier lines into the measuring matrix 21 as described above, and as described in further detail below.

The respiration detector 22 is schematically shown in FIG. 1. This unit may be of any known construction, such as a dilation band around the chest of the examination subject 2, or any other type of detector which monitors the respiratory motion of the lungs, and thus the movement of the thorax and upper abdominal region.

Figure 4:
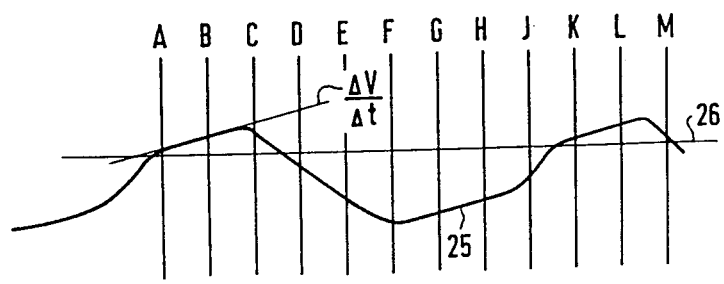
FIG. 4 is a graph corollating the movement signal with the entry of data schematically shown in FIG. 3.

As shown in FIG. 4, a threshold 26 is allocated to the respiratory phase signal 25. Points in time A through M are also shown in FIG. 4, with the formation of the corresponding Fourier lines shown in lower case letters in FIG. 3 taking place at these respective times. As shown in FIG. 3, the corresponding Fourier lines are inserted into the measuring matrix 21 such that Fourier lines which occur when respiratory phase signal is above the threshold 26 are inserted alternately above and below the zero line 20 of the matrix 21 the Fourier lines being symmetrically inserted about the zero line 20 and proceeding farther therefrom on each side as further lines are entered. Fourier lines arising when the respiratory phase signal 25 is below the threshold 26 are inserted into the measuring matrix 21 proceeding from the edges thereof. Those lines are alternately entered on opposite sides of the zero line 20 in symmetric fashion with successively entered lines on each side of the zero line 20 proceeding closer to the zero line 20.

In the examples shown in FIGS. 3 and 4, insertion of Fourier lines a through c, arising at times A through C in FIG. 4, is undertaken proceeding from the zero line 20. Insertion of Fourier lines d through i, occurring at the time D through I in FIG. 4, is undertaken proceeding from the edge of the matrix 21. This is followed by insertion of the Fourier lines k, l and m, occurring at respective times K, L and M in FIG. 4, proceeding again from the zero line 20, and so on. The overall measuring time is now lengthened in comparison to the time which would be necessary to insert a corresponding number of Fourier lines into the measuring matrix without control thereof by the respiratory phase.

By inserting the Fourier lines in the measuring matrix 21 in the manner described above, those Fourier lines generated under respiratory phase control, i.e., when the respiratory phase signal 25 is above the threshold 26, are disposed around the zero line 20 in the matrix 21, so that the image quality is not substantially deteriorated by those Fourier lines which were not acquired under respiratory phase control, i.e., when the respiratory phase signal 25 is below the threshold 26, those Fourier lines being inserted into the measuring matrix 21 at the edges thereof. In order to assure that a desired image quality is maintained, it is preferable to stop insertion of the Fourier lines proceeding from the edge of the matrix 21 when a defined line limit is reached. This limit is referenced schematically at lines 27 and 28 in FIG. 3. When this line limit is reached, the subsequent Fourier lines are only inserted into the matrix 21 successively above and below proceeding from the zero line 20.

Both the threshold 26 and the position of the line limits 27 and 28 can be adjustable. Because motion blur in the resulting image is dependent upon the chronological change ($\Delta t$) in the chest volume ($\Delta V$), the threshold 26 is preferably established based on a change in $\Delta V/\Delta t$ which is as small as possible. The threshold 26 must be selected so as to obtain a faultless spatial allocation of the measured values.

Although modifications and changes may be suggested by those skilled in the art it is the intention of the inventors to embody within the patent warranted hereon all changes and modifications as reasonably and properly come within the scope of their contribution to the art.

We claim as our invention:

1. A nuclear magnetic resonance tomography apparatus for generating an image of a selected layer of an examination subject comprising:
   means for generating a fundamental magnetic field in which said examination subject is disposed;
   means for generating a plurality of gradient fields for selectively varying said fundamental field;
   excitation and measuring means for exciting nuclear spins in said selected layer of said examination subject and acquiring a plurality of signals corresponding to said nuclear spins after excitation in the form of Fourier lines;
   a memory having a measuring matrix having a central zero line and opposite edges spaced from said zero line for storing said Fourier lines for constructing said image;
   means for monitoring selected movement of said examination subject during acqustion of said signals and for generating a movement signal corresponding thereto; and
   means connected to said memory and to said means for monitoring selected movement for controlling insertion of said Fourier lines into said measuring matrix dependent on said movement signal for inserting Fourier lines occurring when said movement signal exceeds a predetermined value in said measuring matrix proceeding from said zero line at increasing distances and for inserting the remainder of said Fourier lines in said measuring matrix at increasing distances respectively proceeding from said edges.

2. An apparatus as claimed in claim 1, wherein said means for controlling insertion of said Fourier lines includes means for alternatingly inserting said Fourier lines on opposite sides of said zero line in said measuring matrix when said movement signal exceeds said predetermined value.

3. An apparatus as claimed in claim 1, wherein said means for controlling insertion of said Fourier lines includes means for alternatingly inserting said remainder of said Fourier lines on opposite sides of said zero line at increasing distances respectively proceeding from said edges.

4. An apparatus as claimed in claim 1, wherein said measuring matrix has selected limit lines therein on opposite sides of said zero line and wherein said means for controlling insertion of said Fourier lines includes means for ceasing insertion of said remainder of said Fourier lines from said edges when said limit lines are reached.

5. An apparatus as claimed in claim 1, wherein said means for monitoring selected movement of said examination subject is a means for monitoring the respiratory phase of said examination subject.

6. A nuclear magnetic resonance tomography apparatus for generating an image of a selected layer of an examination subject comprising:
   means for generating a fundamental magnetic field in which said examination subject is disposed;
   means for generating a plurality of gradient fields for selectively varying said fundamental field;
   excitation and measuring means for exciting nuclear spins in said selected layer of said examination subject and acquiring a plurality of signals corresponding to said nuclear spins after excitation in the form of Fourier lines;
   a memory having a measuring matrix having a central zero line and opposite edges spaced from said zero line for storing said Fourier lines for constructing said image;
   means for monitoring the respiratory phase of said examination subject during acquisition of said signals and for generating a movement signal corresponding to movement of said examination subject due to respiration; and
   means connected to said memory and to said means for monitoring the respiratory phase for controlling insertion of said Fourier lines into said measuring matrix dependent on said respiratory signal for alternatingly inserting Fourier lines occurring when said respiratory signal exceeds a predetermined value in said measuring matrix proceeding from said zero line at increasing distances on opposite sides thereof, and for alternatingly inserting the remainder of said Fourier lines in said measuring matrix on opposite sides of said zero line respectively proceeding from said edges at increasing distances from said edges.

7. An apparatus as claimed in claim 6, wherein said measuring matrix has selected limit lines therein on opposite sides of said zero line and wherein said means for controlling insertion of said Fourier lines includes means for ceasing inserting of said remainder of said Fourier lines from said edges when said limit lines are reached.

8. A method for operating a nuclear magnetic tomography apparatus for generating an image of a selected layer of an examination subject comprising the steps of:
   generating a fundamental magnetic field in which said examination subject is disposed;
   generating a plurality of gradient fields for selectively varying said fundamental field;
   exciting nuclear spins in said selected layer of said examination subject;
   acquiring a plurality of signals corresponding to said nuclear spins after excitation in the form of Fourier lines;
   storing said Fourier lines in a memory in the form of measuring matrix having a central zero line and opposite edges spaced from said zero line for constructing said image;
   monitoring selected movement of said examination subject during acquisition of said signals;

generating a movement signal corresponding to said movement of said examination subject;

inserting Fourier lines into said measuring matrix occurring when said movement signal exceeds a predetermined value proceeding from said zero line at increasing distances therefrom; and inserting the remainder of said Fourier lines in said measuring matrix at increasing distances respectively proceeding from said edges.

9. A method as claimed in claim 8, wherein the step of inserting said Fourier lines occurring when said movement signal exceeds a predetermined value is further defined by alternatingly inserting said Fourier lines on opposite sides of said zero line in said measuring matrix at increasing distances from said zero line.

10. A method as claimed in claim 8, wherein the step of inserting said remainder of said Fourier lines is further defined by alternatingly inserting said remainder of said Fourier lines in said measuring matrix on said opposite sides of said zero line at increasing distances respectively proceeding from said edges.

11. A method as claimed in claim 8, wherein said measuring matrix has a pair of limit lines disposed on opposite sides of said zero line, and comprising the additional step of stopping insertion of said remainder of said Fourier lines in said measuring matrix when said limit lines are reached.

12. A method as claimed in claim 8, wherein the step of monitoring selected movement of said examination subject is further defined by monitoring respiratory movement of said examination sbject.

* * * * *